US012604741B2

(12) United States Patent
Kuo

(10) Patent No.: US 12,604,741 B2
(45) Date of Patent: Apr. 14, 2026

(54) DEEP TRENCH CAPACITOR (DTC) REGION IN SEMICONDUCTOR PACKAGE

(71) Applicant: Taiwan Semiconductor Manufacturing Company, Ltd., Hsinchu (TW)

(72) Inventor: Fu-Chiang Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 779 days.

(21) Appl. No.: 17/701,580

(22) Filed: Mar. 22, 2022

(65) Prior Publication Data

US 2023/0307389 A1      Sep. 28, 2023

(51) Int. Cl.
| | |
|---|---|
| *H01L 23/64* | (2006.01) |
| *H01L 21/48* | (2006.01) |
| *H01L 23/538* | (2006.01) |
| *H01L 25/18* | (2023.01) |

(52) U.S. Cl.
CPC ........ *H01L 23/642* (2013.01); *H01L 21/4857* (2013.01); *H01L 23/5383* (2013.01); *H01L 25/18* (2013.01); *H01L 2223/6666* (2013.01)

(58) Field of Classification Search
CPC ............. H01L 23/642; H01L 29/66181; H01L 29/945; H01L 28/90; H01L 25/18; H01L 23/5383; H01L 23/5384; H01L 23/5386; H01L 21/4857; H01L 25/0652
See application file for complete search history.

(56) References Cited

U.S. PATENT DOCUMENTS

| | | | |
|---|---|---|---|
| 2010/0181645 A1 | 7/2010 | Marenco | |
| 2013/0161792 A1* | 6/2013 | Tran ........................ H01L 29/92 |
| | | | 438/386 |
| 2017/0104057 A1 | 4/2017 | Voiron | |
| 2020/0135939 A1* | 4/2020 | Shibata ............... H01L 27/0207 |
| 2022/0028827 A1* | 1/2022 | Ding ................... H01L 23/5383 |

FOREIGN PATENT DOCUMENTS

CN          114078839 A      2/2022

OTHER PUBLICATIONS

First office action received in the counterpart Taiwan application 112104880, mailed on Sep. 28, 2023.

* cited by examiner

*Primary Examiner* — Jessica S Manno
*Assistant Examiner* — Ricky Verdes
(74) *Attorney, Agent, or Firm* — KILPATRICK TOWNSEND & STOCKTON LLP

(57) ABSTRACT

A semiconductor structure is provided. The semiconductor structure includes a substrate and a deep trench capacitor (DTC) region formed in the substrate. The DTC region includes a plurality of DTC units, and each DTC unit includes: a trench extending downwardly from a top surface of the substrate; a first conductive layer disposed in the trench; a second conductive layer disposed in the trench; and a dielectric layer sandwiched by the first conductive layer and the second conductive layer. Each DTC unit is elongated, and a first group of the plurality of DTC units extend horizontally in a first direction, whereas a second group of the plurality of the DTC units extend horizontally in a second direction.

20 Claims, 9 Drawing Sheets

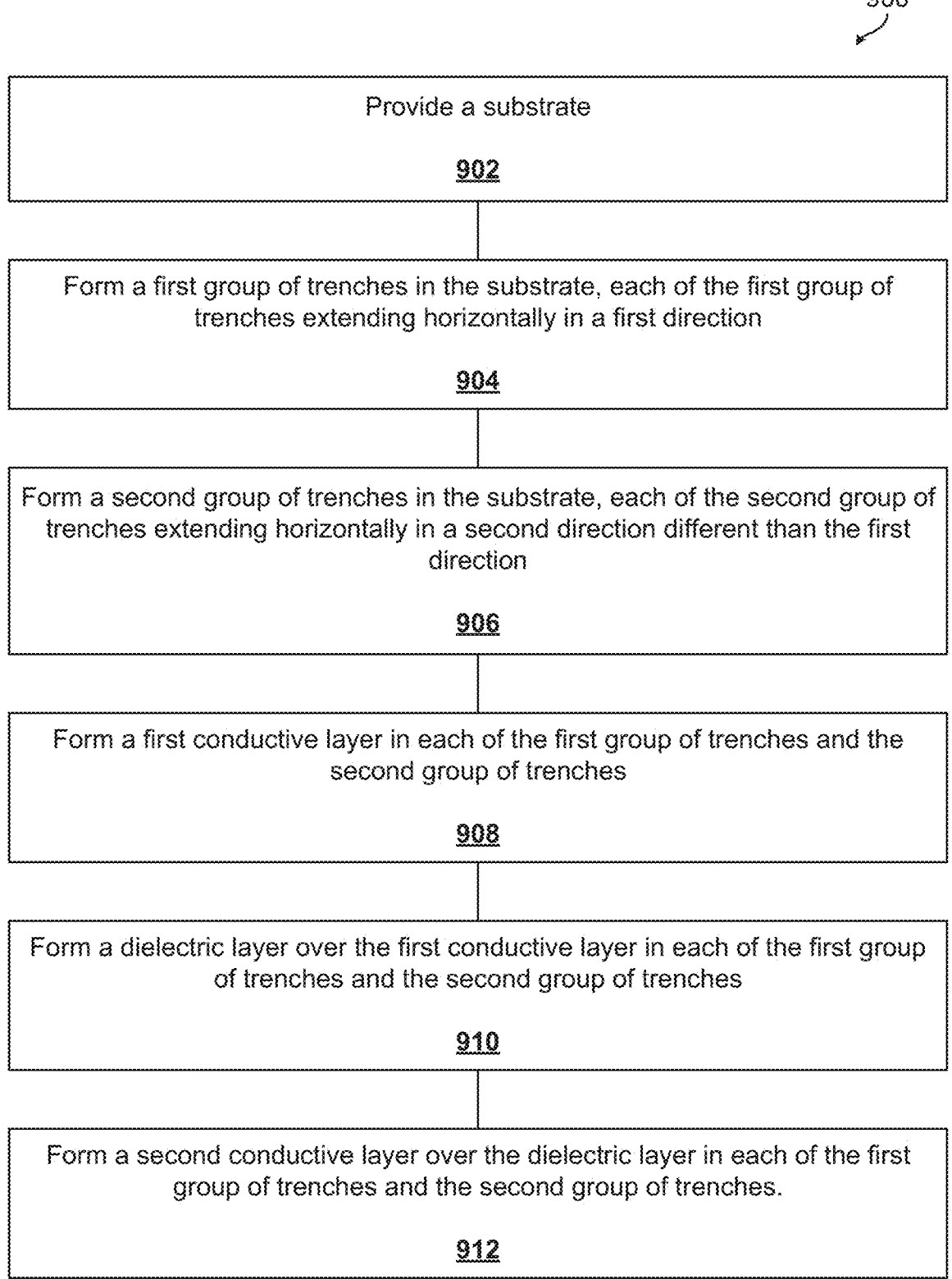

900

Provide a substrate

902

Form a first group of trenches in the substrate, each of the first group of trenches extending horizontally in a first direction

904

Form a second group of trenches in the substrate, each of the second group of trenches extending horizontally in a second direction different than the first direction

906

Form a first conductive layer in each of the first group of trenches and the second group of trenches

908

Form a dielectric layer over the first conductive layer in each of the first group of trenches and the second group of trenches

910

Form a second conductive layer over the dielectric layer in each of the first group of trenches and the second group of trenches.

DEEP TRENCH CAPACITOR (DTC) REGION IN SEMICONDUCTOR PACKAGE

FIELD

Embodiments of the present disclosure relate generally to capacitors, and more particularly to deep trench capacitor (DTC) regions in semiconductor packages.

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart illustrating an example method of fabricating a semiconductor structure including a DTC region in accordance to some embodiments.

DETAILED DESCRIPTION OF THE INVENTION

Figure 1:
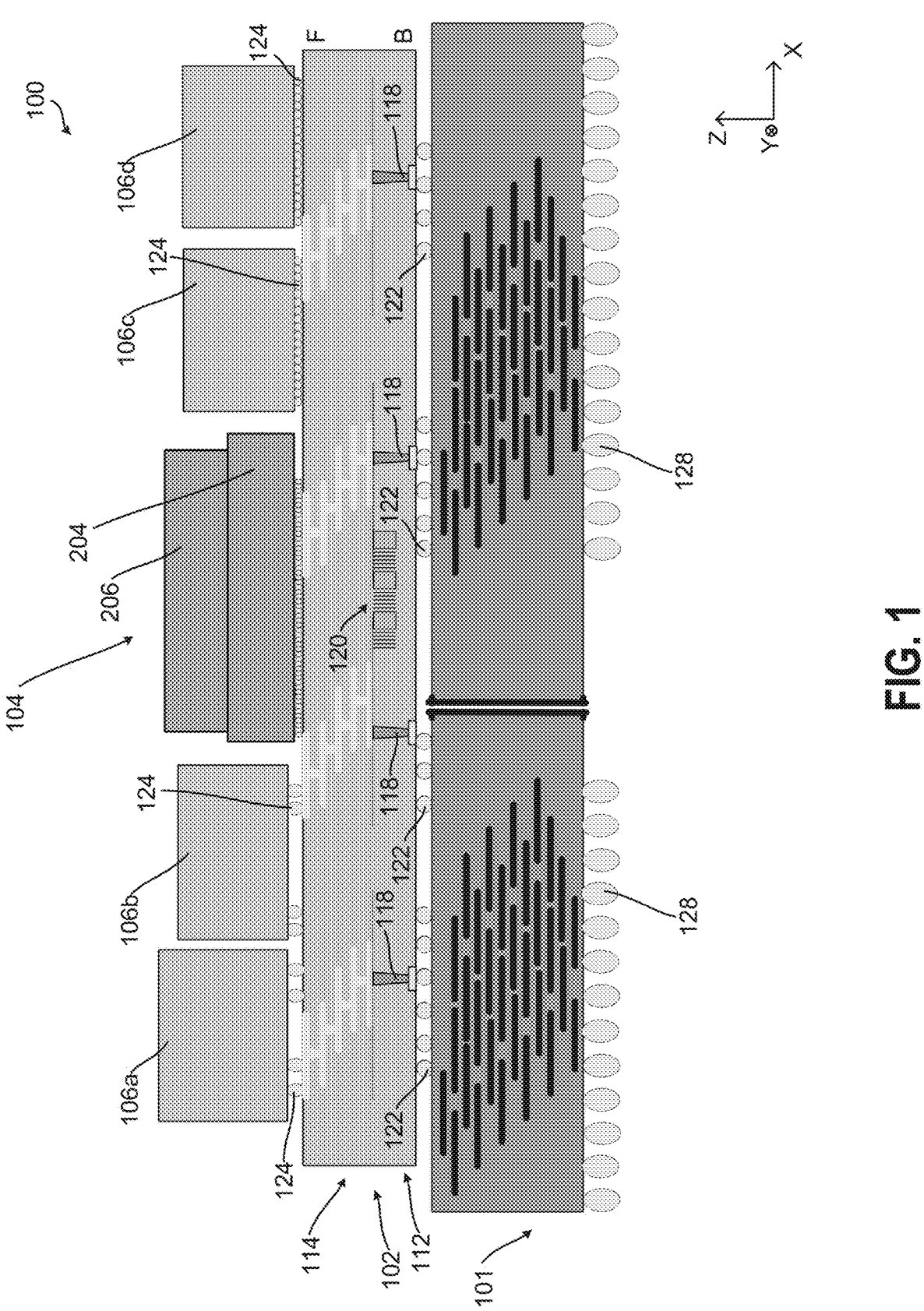
FIG. 1 is a schematic diagram illustrating an example semiconductor package in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Capacitors are used for a myriad of purposes on modern integrated circuits (IC). For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high-density capacitor in either the IC technology of interest or in a stand-alone process that results in an integrated capacitor device easily mountable on the IC.

The miniaturization of devices on modern integrated circuits resulted in challenges for circuit designers dealing with power delivery networks (PDNs, also known as power distribution networks). The last decade saw the rise of FinFET devices, bringing higher drive strengths compared to prior planar devices. The use of FinFET devices increases the drive strength per unit area, requiring higher current densities and larger current transients. This trend has resulted in chips that are increasingly sensitive to fluctuating supply voltages, exacerbating the power integrity challenges of system design. Circuit designers rely on decoupling capacitors as a fundamental tool for reducing the impedance of PDNs and suppressing noise by decoupling or bypassing one part of a circuit from another. For signals, noise from the interconnect can be shunted through a decoupling capacitor before being passed to another circuit. However, decoupling capacitors are generally physically located in close proximity to the desired circuit in order to reduce parasitic resistances and inductances.

On the other hand, packaging technologies are evolving rapidly, providing more platforms where advanced capacitor technologies can be employed. As will be described below, advanced capacitor technologies may be used in advanced packaging technologies such as Chip-on-Wafer-on-Substrate (CoWoS) and System on Integrated Chips (SoIC)

technologies. These advanced packaging technologies enable the application of advanced capacitor technologies.

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

On the other hand, those multiple chips that are bonded to the interposer in a CoWoS structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding. In another implementation, the stacking dies are bonded together using fusion bonding.

Stacking dies featuring ultra-high-density-vertical stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

In accordance with some aspects of the disclosure, a semiconductor structure including a deep trench capacitor (DTC) region is provided. The semiconductor structure includes a substrate and a multilayer interconnect (MLI) structure formed on the substrate. The DTC region is formed in the substrate. The DTC region includes a plurality of DTC units. In one embodiment, each DTC unit includes a trench extending downwardly from a top surface of the substrate; a first conductive layer disposed in the trench; a second conductive layer disposed in the trench; and a dielectric layer sandwiched by the first conductive layer and the second conductive layer. One or more chips are bonded to the MLI structure, and the DTC region is electrically connected to the one or more chips through the MLI structure. In one embodiment, the semiconductor structure is an interposer. In another embodiment, the semiconductor structure is a DTC die specifically designed to provide a high-density DTC region.

In one embodiment, the DTC region is organized by DTC unit cells, and each DTC unit cell includes one or more DTC unit groups. Each DTC unit group includes multiple DTC units parallel to each other. In one example, each DTC unit group has a rectangular (e.g., square) contour, and the plurality of DTC unit groups are arranged in a plurality of rows and a plurality of columns. The DTC units in the DTC region extend either in a first direction or in a second direction perpendicular to the first direction. Specifically, neighboring DTC unit groups have extending directions perpendicular to each other. In another example, each DTC unit group has a hexagonal contour, and the DTC units in the DTC region extends in a first direction, a second direction, or a third direction. As a result, the stress caused by high-density trenches disposed in a large chip area has components in two perpendicular directions, thereby reducing the warpage of the chip.

The DTC region can be considered as a bank of available DTC units, and any number of DTC units can form a capacitor with a capacitance proportional to the number of DTC units. Once the design requirement of a chip to be connected to a DTC zone is known, the size of the DTC zone 402 or the number of DTC units to be included in the DTC zone can be calculated accordingly. When the DTC region is divided into multiple DTC zones, the boundaries among the DTC zones can cross the boundaries between the DTC unit groups or the boundaries between the DTC unit cells. Therefore, the DTC region 120 can be divided into the DTC zones in a flexible manner.

FIG. 1 is a schematic diagram illustrating an example semiconductor package 100 in accordance with some embodiments. In the example shown in FIG. 1, the semiconductor package 100 includes an interposer 102, a SoIC die stack 104, and multiple chips 106a-106d, among other components. The SoIC die stack 104 and the multiple chips 106a-106d are located on and bonded to the top surface of the interposer 102 in the vertical direction (i.e., the Z-direction, as shown in FIG. 1). The SoIC die stack 104 and the multiple chips 106a-106d are located at various locations in the horizontal plane (i.e., the X-Y plane, as shown in FIG. 1) in a sis-by-side manner. The interposer 102 is further bonded to a package substrate 101. In other words, the semiconductor package 100 is a CoWoS structure.

The interposer 102 provides an interface circuit between the package substrate 101, which may be bonded to a printed circuit board (PCB), and one or more of the SoIC die stack 104 and the multiple chips 106a-106d. In the example shown in FIG. 1, the interposer 102 includes a substrate section 112 and an interposer multilayer interconnect (MLI) structure 114. In one embodiment, the substrate section 112 is a silicon substrate. The substrate section 112 includes one or more through-silicon vias (TSVs) 118 through the substrate section 112. In the example shown in FIG. 1, a deep trench capacitor (DTC) region 120 is disposed in the substrate section 112, and a portion of or the entire DTC region 120 can be electrically connected to one or more of the SoIC die stack 104 and the multiple chips 106a-106d. Details of the DTC region 120 will be described below with reference to FIGS. 2-9. It should be understood that the semiconductor package 100 shown in FIG. 1 is one example of many applications of the DTC region 120. Another example will be described below with reference to FIG. 8.

The interposer MLI structure 114 includes a combination of dielectric layers and conductive layers configured to form various interconnect structures. The conductive layers are configured to form vertical interconnect features (e.g., vias, etc.) and horizontal interconnect features (e.g., conductive lines extending in the X-Y plane). Vertical interconnect features typically connect horizontal interconnect features in different layers (e.g., a first metal layer often denoted as "M1" and a fifth metal layer often denoted as "M5") of the interposer MLI structure 114. The interposer MLI structure 114 is configured to route signals and/or distribute signals (e.g., clock signals, power signals, ground signals) to one or more of the SoIC die stack 104 and the chips 106a-106d. It should be understood that although the interposer MLI structure 114 is depicted in FIG. 1 with a given number of dielectric layers and conductive layers, the present disclosure contemplates interposer MLI structures having more or fewer dielectric layers and/or conductive layers depending on design requirements.

In addition, the interposer 102 shown in FIG. 1 also includes C4 copper bumps 122 and micro-bumps (i.e., μBumps) 124. At the back side (denoted as "B" in FIG. 1) of the interposer 102, the C4 copper bumps are used to bond the interposer 102 to the package substrate 101. It should be understood that C4 copper bumps are exemplary rather than limiting, and other types of bonding techniques may be employed in other implementations. Each of the TSVs 118 is electrically connected to at least one C4 copper bump 122.

At the front side (denoted as "F" in FIG. 1) of the interposer 102, the micro-bumps 124 are used to bond the chips 106a-106d to the interposer 102. It should be understood that micro-bumps are exemplary rather than limiting, and other types of bonding techniques may be employed in other implementations. As to the interface between the interposer 102 and the SoIC die stack 104, the SoIC die stack 104 can be bonded to the interposer 102 using hybrid bonding in one implementation. In other implementations, the SoIC die stack 104 can be bonded to the interposer 102 using other bonding techniques such as micro-bumps and fusion bonding.

As a result, the package substrate 101 can be electrically connected to one or more of the SoIC die stack 104 and the chips 106a-106d through the interposer 102. An exemplary electrical path includes the C4 copper bump 122, the TSV 118, the interposer MLI structure 114, and the micro-bump 124.

The chips 106a-106d are independent chips, which fulfill various functions. Each of the chips 106a-106d is one of, for example, a logic chip, a memory chip, a computation chip, a sensor chip, a radio frequency (RF) chip, a high voltage (HV) chip, and the like.

In the example shown in FIG. 1, the SoIC die stack 104 includes a bottom die 204 and a top die 206. A bonding layer is formed on the top surface of the bottom die 204, and another bonding layer is formed on the bottom surface of the top die 206. Those bonding layers are made of a dielectric (e.g., silicon dioxide) and used for bonding the top die 206 to the bottom die 204. Pairs of hybrid bonding metal pads are formed in those bonding layers. When the top die 206 and the bottom die 204 are bonded together, each pair of hybrid bonding metal pads are aligned in the X-Y plane and in contact with each other, providing an electrical path between the bottom die 204 and the top die 206. As the hybrid bonding metal pads can have small critical dimensions and pitches, the SoIC die stack 104 can achieve better interconnect density and performance (e.g., faster speeds, higher bandwidth, and the like).

For die-to-die boding, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility. Pick-and-place systems are often used to handle dies in the context of die-to-die boding or die-to-wafer boding. A pick-and-place system is an automatic system that can pick a top die and place it onto the bottom die or a host wafer, often in a high-speed manner.

Figure 2:
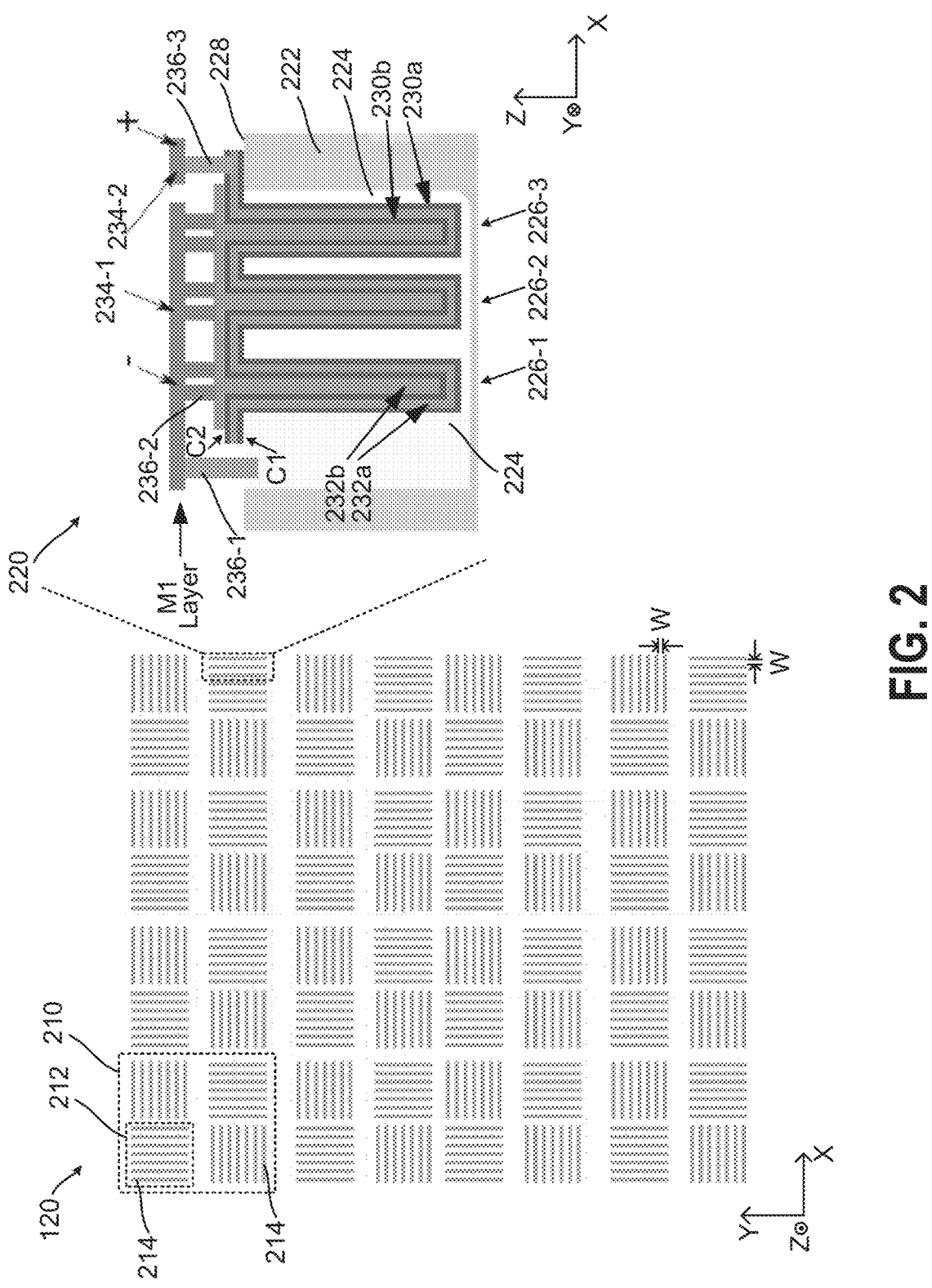
FIG. 2 is a diagram illustrating a top view of an example DTC region in accordance with some embodiments.

FIG. 2 is a diagram illustrating a top view of an example DTC region 120 in accordance with some embodiments. In the example shown in FIG. 2, the DTC region 120 includes an array of DTC unit cells 210 arranged in multiple rows and multiple columns extending in the X-Y plane. Each DTC unit cell 210 includes four DTC unit groups 212 in this example. Each DTC unit group 212 includes six DTC units 214 in this example. For half of all the DTC unit groups 212 shown in FIG. 2, the six DTC units 214 in each DTC unit group 212 are parallel to each other and extend in a first direction (i.e., the X-direction shown in FIG. 2). For the other half of all the DTC unit groups 212 shown in FIG. 2, the six DTC units 214 in each DTC unit group 212 are parallel to each other and extend in a second direction (i.e., the Y-direction shown in FIG. 2). In some embodiments, the DTC units 214 are elongated. The space between two neighboring DTC units 214 has a width W in the direction perpendicular to the extending direction. In one embodiment, the width W is larger than 0.2 μm. In another embodiment, the width W is larger than 0.1 μm. In one example, the width W is 0.12 μm. In another example, the width W is 0.15 μm. In yet another example, the width W is 0.18 μm.

It should be understood that the arrangement shown in FIG. 2 is exemplary, and one skilled in the art would appreciate other variations and modifications. For instance, instead of six DTC units 214 in one DTC unit group 212, each DTC unit group 212 may include three, four, five, or eight DTC units 214. In general, each DTC unit group 212 may include a first number of DTC units 214, and the first number is an integer larger than one. In some embodiments, the first number is an integer equal to or larger than five.

A DTC unit 214 is a building block, each corresponding to a unit capacitance. All the DTC units 214 in the DTC region 120 are available to be combined to provide a target capacitance based on circuit design requirements. In other words, the DTC region 120 offers a bank of DTC units 214 that can be utilized flexibly.

In the example shown in FIG. 2, three DTC units 214 are connected in parallel to form a capacitor 220 (the cross-sectional view of the capacitor 220 is shown at the right side of FIG. 2). In the example shown in FIG. 2, the capacitor 220 is formed in a substrate 222, which is often a silicon substrate having a first conductivity type (e.g., n−). In one embodiment, the substrate 222 is the substrate section 112 of the interposer 102 shown in FIG. 1. In another embodiment, the substrate 222 is the substrate of a die (e.g., a bottom die 204 shown in FIG. 1) that is bonded to another die using, for example, hybrid bonding. A conductive region 224, which often is highly doped and has a second conductivity type (e.g., p++) is formed within the substrate 222. Three trenches 226-1, 226-2, and 226-3, each corresponding to a DTC unit 214, extend downwardly from a substrate upper surface 228 into the conductive region 224. Alternatively, if the only required component of this integrated circuit is a capacitor that does not require capacitor-to-capacitor isolation (i.e., one plate of all capacitors can operate at the same potential), a heavily doped p++ or n++ wafer can be used to reduce the cost associated with the formation of the conductive region 224.

A first dielectric layer 230*a* is formed in the trenches 226-1, 226-2, and 226-3, and a first conductive layer 232*a* (e.g., a first polysilicon layer) is formed over the first dielectric layer 230*a*. A second dielectric layer 230*b* is formed in the trenches 226-1, 226-2, and 226-3 and over the first conductive layer 232*a*, and a second conductive layer 232*b* is formed in the trenches 226-1, 226-2, and 226-3 and over the second dielectric layer 230*b*. In one embodiment, the first dielectric layer 230*a* and the second dielectric layer 230*b* are made of a high-K dielectric with a high dielectric constant, as compared to silicon dioxide. In other words, the first dielectric layer 230*a* and the second dielectric layer 230*b* are high-K dielectric layers. In one embodiment, the first conductive layer 232*a* and the second conductive layer 232*b* are both polysilicon layers. In another embodiment, the first conductive layer 232*a* and the second conductive layer 232*b* are both metal layers (e.g., Ti layers).

The conductive region 224 is electrically connected to a metal track 234-1 in the M1 layer through a contact 236-1 (e.g., a via). The second conductive layer 232*b* is electrically connected to the metal track 234-1 through, for example, six contact structures 236-2 (e.g., vias). The first conductive layer 232*a* is electrically connected to a metal track 234-2 in the M1 layer through a contact 236-3 (e.g., a via).

As such, the metal tracks 234-1 and 234-2 and the contacts 236-1, 236-2, and 236-3 couple a first capacitor C1 (which has the conductive region 224 and the first conductive layer 232*a* separated by the first dielectric layer 230*a*), in parallel with a second capacitor C2 (which has the first conductive layer 232*a* and the second conductive layer 232*b* separated by the second dielectric layer 230*b*). Thus, the capacitor 220 can be regarded as two capacitors C1 and C2, which are "stacked" over one another and which are coupled in parallel to increase the capacitance density. In the example shown in FIG. 2, the metal track 234-2 is connected to a positive node through, for example, higher metal layers (e.g., the M2 layer, the M3 layer, etc.), while the metal track 234-1 is connected to a negative node through, for example, higher metal layers (e.g., the M2 layer, the M3 layer, the M4 layer, the M5 layer, etc.).

One skilled in the art should appreciate other variations and modifications of the example shown in FIG. 2. For instance, in another embodiment (shown in FIG. 3), trenches can be formed directly in the substrate without the conductive region, and two conductive layers and one dielectric layer sandwiched therebetween can be formed in the trenches, as compared to two conductive layers and two dielectric layers. Various designs and configurations can be employed depending on the design requirement and the application context.

In the example shown in FIG. 2, the DTC units 214 in the DTC region extend either in the X-direction or in the Y-direction. Specifically, neighboring DTC unit groups 212 (either in the X-direction or in the Y-direction) have extending directions perpendicular to each other. As a result, the stress caused by high-density trenches disposed in a large chip area has components in two perpendicular directions, thereby reducing the warpage of the chip.

Figure 3:
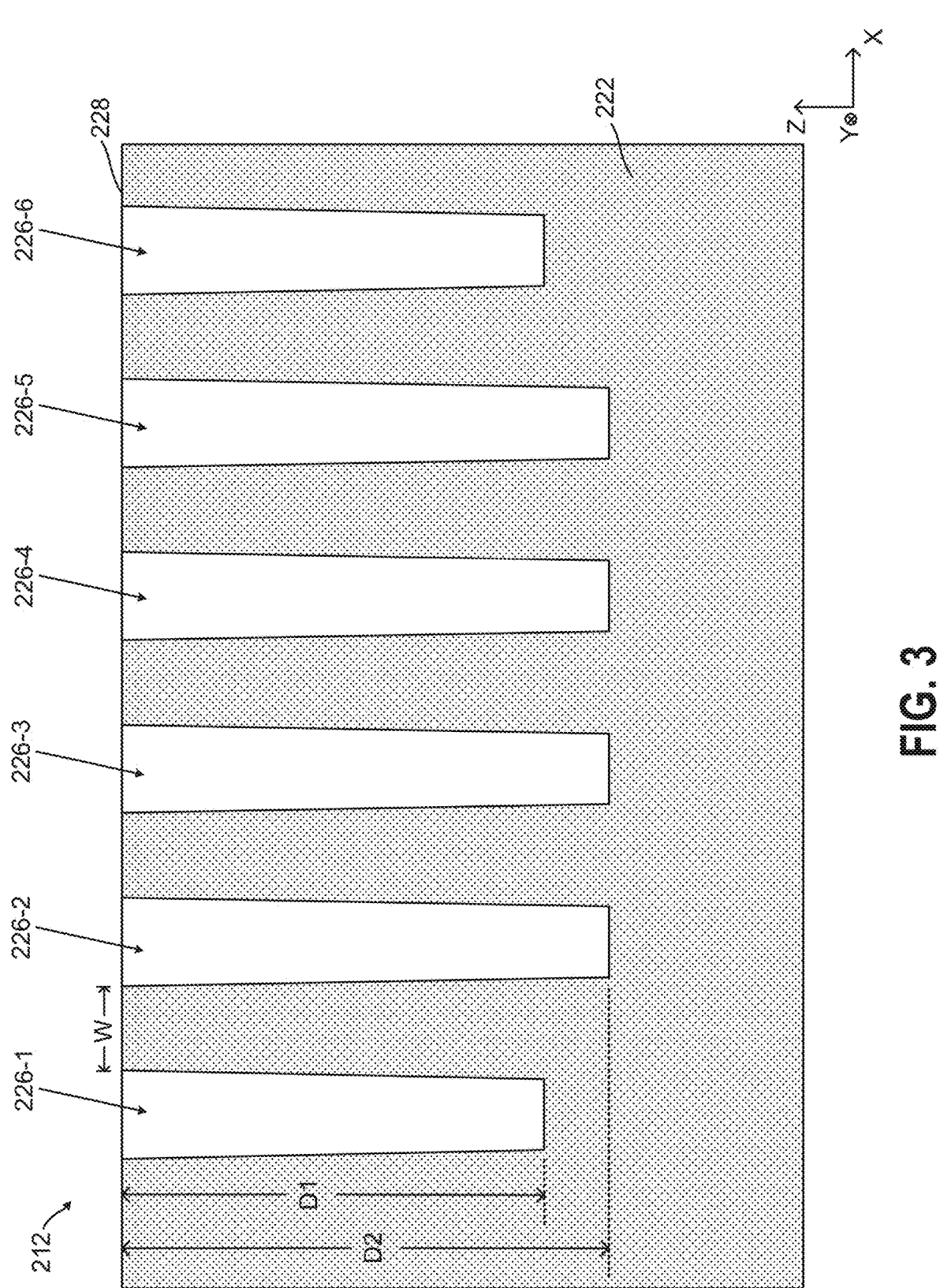
FIG. 3 is a diagram illustrating a cross-sectional view of an example DTC unit group in accordance with some embodiments.

FIG. 3 is a diagram illustrating a cross-sectional view of an example DTC unit group in accordance with some embodiments. In the example shown in FIG. 3, the DTC unit group 212 has six DTC units 214, corresponding to six trenches 226-1, 226-2, 226-3, 226-4, 226-5, and 226-6 (collectively, 226). The trenches 226-1, 226-2, 226-3, 226-4, 226-5, and 226-6 are formed in the substrate 222. As mentioned above, the space between two neighboring trenches 226, at the upper surface 228 of the substrate 222) has a width Win the direction perpendicular to the extending direction. In one embodiment, the width W is larger than 0.2 μm. In another embodiment, the width W is larger than 0.1 μm. In one example, the width W is 0.12 μm. In another example, the width W is 0.15 μm. In yet another example, the width W is 0.18 μm.

In one embodiment, the aspect ratio of each trench 226 is larger than one. In another embodiment, the aspect ratio of each trench 226 is larger than ten. In yet another embodiment, the aspect ratio of each trench 226 is larger than one hundred.

In one embodiment, the depth of the trenches 226-1 and 226-6 is D1, while the depth of the trenches 226-2, 226-3, 226-4, and 226-5 is D2, and D1 is smaller than D2. That is, the depth of the outmost trenches (also referred to as "edge trenches", e.g., 226-1 and 226-6) in the X-direction is smaller than the depth of other trenches (also referred to as "non-edge trenches", e.g., 226-1 and 226-6). In one example, D1 is smaller than D2 by 1%. In another example, D1 is smaller than D2 by 2%. In yet another example, D1 is smaller than D2 by 3%. In still another example, D1 is smaller than D2 by 5%.

Figure 4:
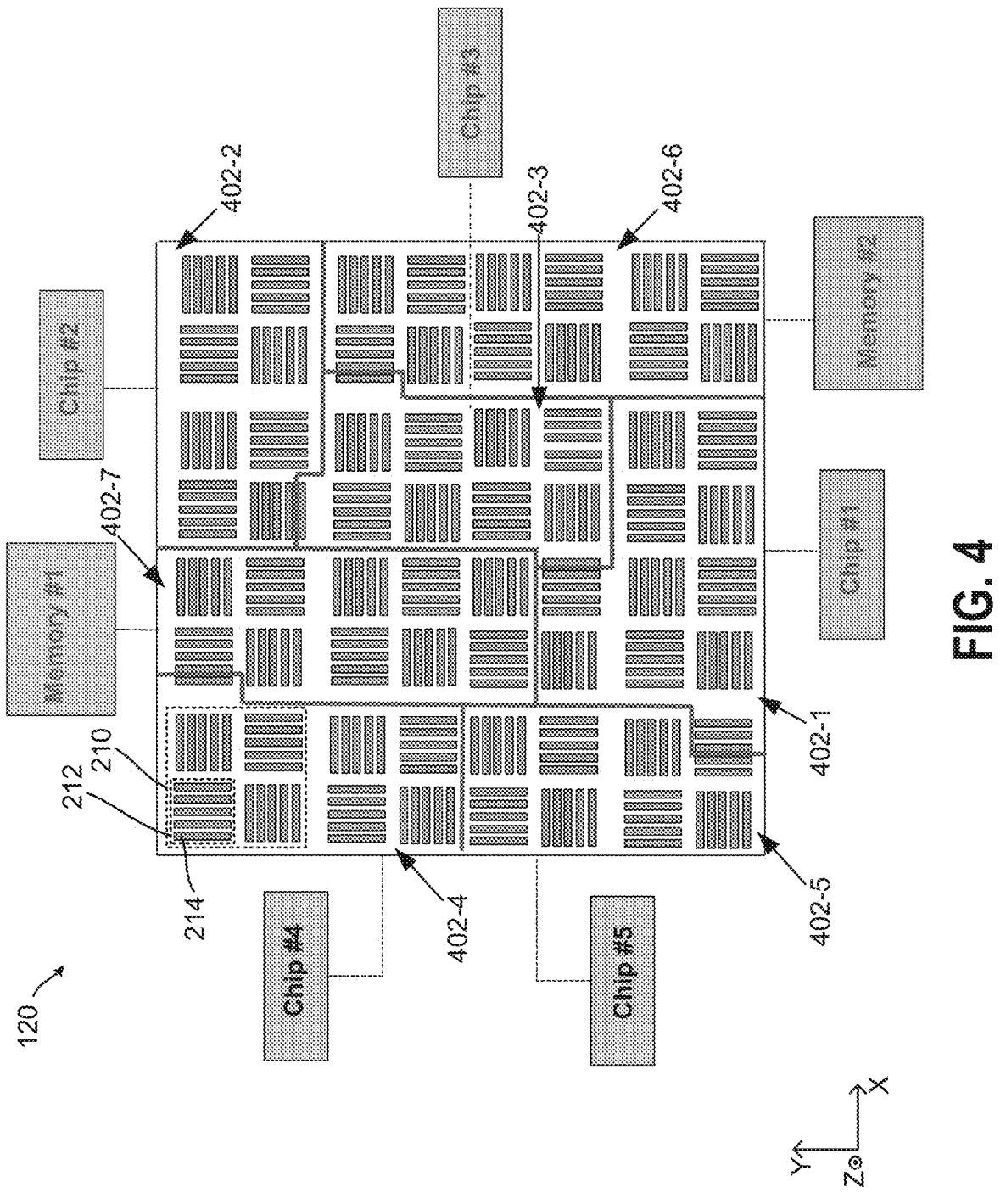
FIG. 4 is a diagram illustrating an example DTC region and multiple chips connected to the DTC region in accordance with some embodiments.

FIG. 4 is a diagram illustrating an example DTC region 120 and multiple chips connected to the DTC region 120 in accordance with some embodiments. Like the DTC region 120 shown in FIG. 2, the example DTC region 120 shown in FIG. 4 includes an array of DTC unit cells 210 arranged in multiple rows and multiple columns extending in the X-Y plane. Each DTC unit cell 210 includes four DTC unit groups 212. Each DTC unit group 212 includes five DTC units 214 in this example. The DTC units 214 in each DTC unit group 212 are parallel to each other and extend in either the X-direction or the Y-direction, as shown in FIG. 4.

Multiple chips, including memory #1, memory #2, chip #1, chip #2, chip #3, chip #4, and chip #5, are schematically illustrated. In one embodiment, these chips are located at a different layer, in the Z-direction, than the DTC region 120. In one example, these chips are located on the interposer 102 shown in FIG. 1, while the DTC region 120 is disposed in the interposer 102. The DTC region 120 is divided into seven DTC zones 402-1, 402-2, 402-3, 402-4, 402-5, 402-6, and 402-7 (collectively, 402). Each DTC zone 402 has its own size and shape and includes its own number of DTC units 214. The number of DTC units 214 of each DTC zone 402 corresponds to a specific capacitance. The more DTC units 214 a DTC zone 402 has, the larger the overall capacitance of the DTC zone has. For instance, the DTC zone 402-1 includes fifty-two DTC units 214, while the DTC zone 402-2 includes thirty-nine DTC units 214. The capacitance formed by those fifty-two DTC units 214 in the DTC zone 402-1 corresponds to the design requirement of chip #1, while the capacitance formed by those thirty-nine DTC units 214 in the DTC zone 402-2 corresponds to the design requirement of chip #2.

As mentioned above, the DTC 120 can be considered as a bank of available DTC units 214, and any number of DTC units 214 can form a capacitor with a capacitance proportional to the number of DTC units 214. Once the design requirement of a chip to be connected to a DTC zone 402 is known, the size of the DTC zone 402 can be calculated accordingly. In one implementation, the number of DTC units 214 is calculated by dividing the target capacitance for the chip by the unit capacitance that one DTC unit 214 provides.

It should be understood that although the DTC region 120 is organized by DTC unit groups 212 and DTC unit cells 210, the division does not have to follow the boundaries between the DTC unit groups 212 or the boundaries between the DTC unit cells 210. In other words, the boundaries among the DTC zones 402 can cross the boundaries between the DTC unit groups 212 or the boundaries between the DTC unit cells 210. A portion of a DTC unit cell 210 can belong to (i.e., be included in) one DTC zone 402, while another portion of the DTC unit cell 210 can belong to (i.e., be included in) another DTC zone 402. Likewise, a portion of a DTC unit group 212 can belong to (i.e., be included in) one DTC zone 402, while another portion of the DTC unit group 212 can belong to (i.e., be included in) another DTC zone 402. Therefore, the DTC region 120 can be divided into the DTC zones in a flexible manner.

It should also be understood that all the DTC units 214 are used (i.e., assigned to a DTC zone 402) in the example shown in FIG. 4, this does not have to be the case. In some embodiments, a portion of the DTC region can be unused (i.e., not assigned to any DTC zone 402 and reserved for future use).

It should be understood that the DTC units 214 assigned in one DTC zone 402 can be connected together by, for example, metal tracks in one or more metal layers. In one example, the DTC units 214 assigned in one DTC zone 402 are connected by metal tracks in the M1 layer. In another example, the DTC units 214 assigned in one DTC zone 402 are connected by metal tracks in the M1 layer or the M2 layer. In yet another example, the DTC units 214 assigned in one DTC zone 402 are connected by metal tracks in the M1 layer, the M2 layer, or the M3 layer. Routing resources can be allocated accordingly depending on the geometry, location, and size of the DTC zone 402.

In one embodiment, the capacitance density of the DTC region 120 is larger than 300 nF/mm$^2$. In one example, the capacitance density of the DTC region 120 is 320 nF/mm$^2$. In another example, the capacitance density of the DTC region 120 is 340 nF/mm$^2$.

In one embodiment, the location of each DTC zone 402 is arranged such that the sum of the lateral distances (i.e., in the X-Y plane) between each DTC zone 402 and its corresponding chip is minimized. For example, chip #1 is located at a lower position in the Y-direction than memory #1 (both chip #1 and memory #1 are disposed in a higher or lower plane in the Z-direction than the DTC region 120, as explained above). Hence, the DTC zone 402-1 corresponding to chip #1 is located at a lower position in the Y-direction than the DTC zone 402-7 corresponding to memory #1. As a result, the overall impedance and voltage drop (i.e., IR drop) may be achieved.

Figure 5A:
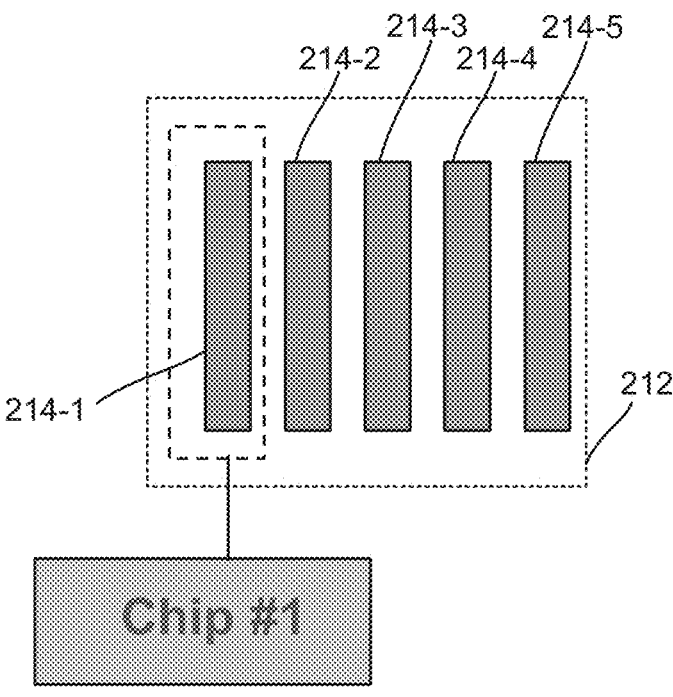
FIG. 5A is a diagram illustrating one DTC unit connected to a chip in accordance with some embodiments.
Figure 5B:
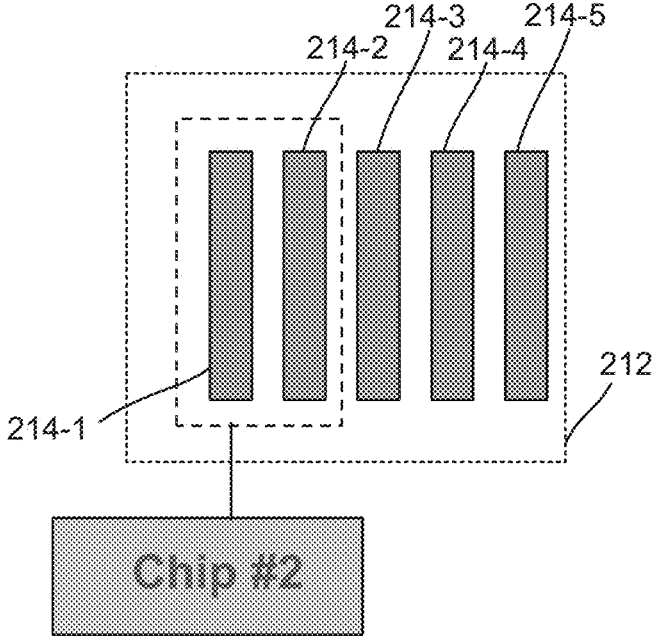
FIG. 5B is a diagram illustrating two DTC units connected to a chip in accordance with some embodiments.

FIG. 5A is a diagram illustrating one DTC unit 214 connected to a chip in accordance with some embodiments. FIG. 5B is a diagram illustrating two DTC units 214 connected to a chip in accordance with some embodiments. As explained above, any number of DTC units 214 can form a capacitor with a capacitance proportional to the number of DTC units 214. In the example shown in FIG. 5A, a single DTC unit 214-1 is connected to chip #1, which requires a small capacitance, and the DTC units 214-2 to 214-5 can be connected to another chip or remain unused. In the example shown in FIG. 5B, two DTC units 214-1 and 214-2 are connected to chip #2, which requires a small capacitance (however, larger than that for chip #1), and the DTC units 214-3 to 214-5 can be connected to another chip or remain unused.

Figure 6A:
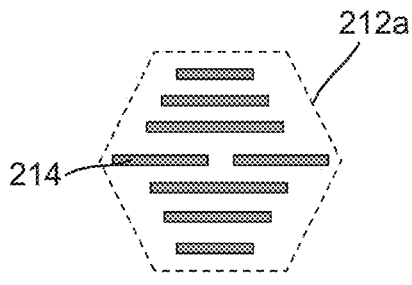
FIGS. 6A-6C are diagrams illustrating example DTC unit groups in accordance with some embodiments.
Figure 6B:
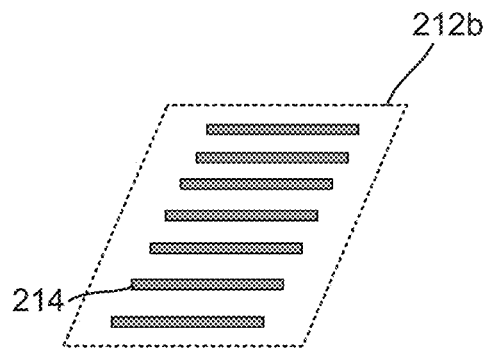
Figure 6C:
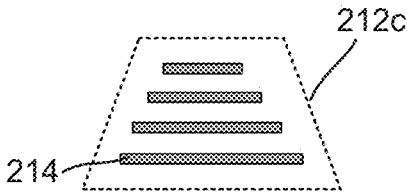

FIGS. 6A-6C are diagrams illustrating example DTC unit groups 211a, 212b, and 212c in accordance with some embodiments. Different from the DTC unit group 211 shown in FIG. 2, each of the DTC unit groups 211a, 212b, 212c has a contour which is not a rectangular contour. The DTC unit group 211a has a contour with a hexagon shape (i.e., a hexagonal contour). The DTC unit group 211b has a contour with a parallelogram shape (i.e., a parallelogrammatic contour). The DTC unit group 211c has a contour with a trapezoid shape (i.e., a trapezoidal shape). It should be noted these examples are not intended to be limiting, and DTC unit groups having contours with other shapes can be employed as well. When various DTC unit groups 211 having different shapes are available, the flexibility of organizing DTC unit groups 211 is increased as the DTC region 120 does not have to be a rectangle as shown in FIG. 2.

Figure 7:
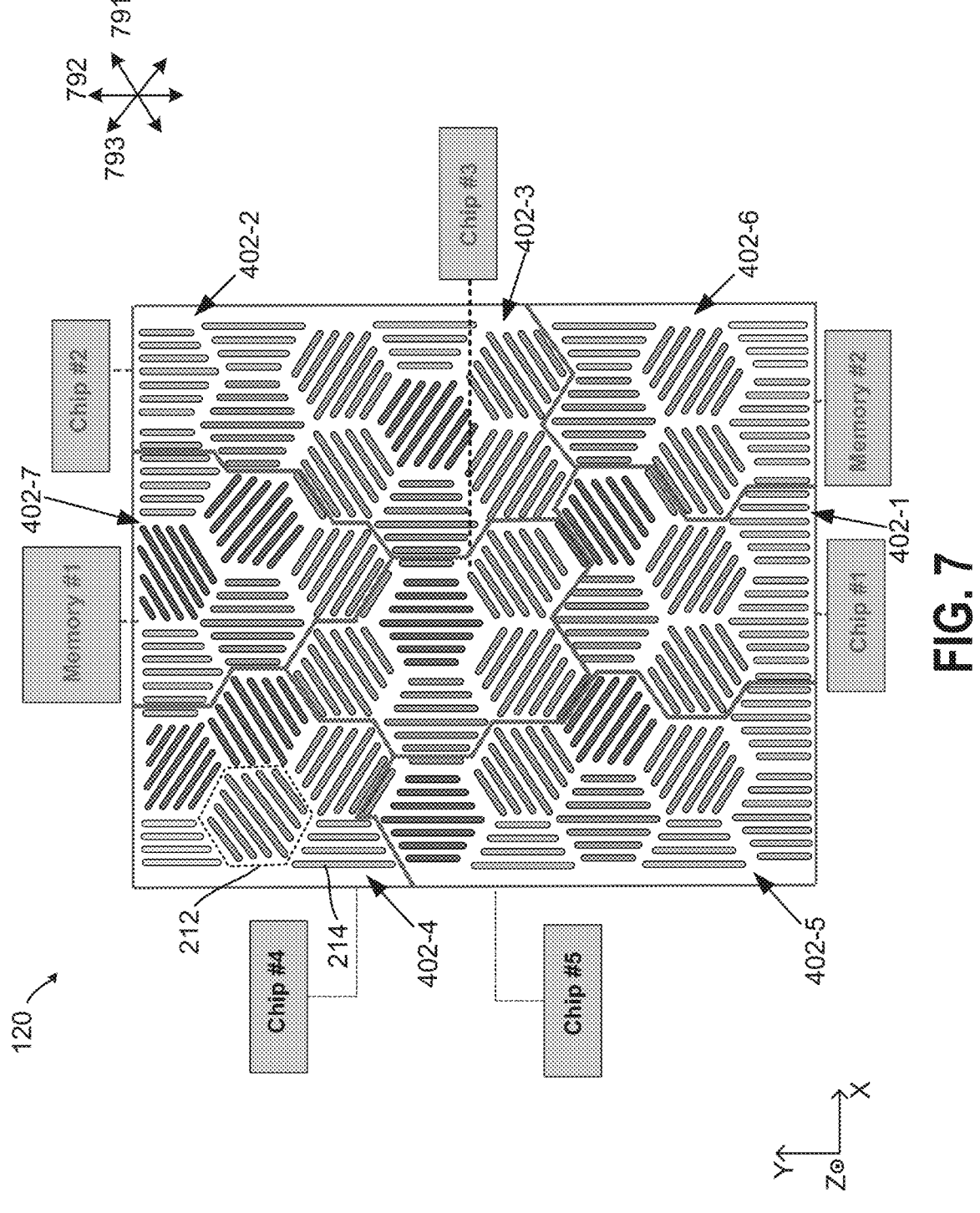
FIG. 7 is a diagram illustrating an example DTC region and multiple chips connected to the DTC region in accordance with some embodiments.

FIG. 7 is a diagram illustrating an example DTC region 120 and multiple chips connected to the DTC region 120 in accordance with some embodiments. Unlike the DTC region 120 shown in FIG. 4, the example DTC region 120 shown in FIG. 7 includes DTC unit groups 212, and each DTC unit group 212 has a contour with a hexagon shape. Also, since the DTC region 120 has a rectangular shape, a portion of a DTC unit group is used at the edge of the DTC region.

Each DTC unit cell 210 includes seven DTC units 214 in this example. The DTC units 214 in each DTC unit group 212 are elongated and have different lengths. The DTC units 214 in each DTC unit group 212 are parallel to each other and extend in one of the three directions 791, 792, and 793, as shown in FIG. 7. The angle between any two of the three directions 791, 792, and 793 is 60 degrees in the example shown in FIG. 7. Since DTC unit groups 212 have extending directions in three different directions 791, 792, and 793, the stress caused by high-density trenches disposed in a large chip area has components in three directions, thereby reducing the warpage of the chip.

One skilled in the art would appreciate a DTC region 120 that includes DTC units 214 extending in more than three directions based on the example described herein. More extending directions can further reduce the warpage of the chip.

Multiple chips, including memory #1, memory #2, chip #1, chip #2, chip #3, chip #4, and chip #5, are schematically illustrated. In one embodiment, these chips are located at a different layer, in the Z-direction, than the DTC region 120. The DTC region 120 is divided into seven DTC zones 402-1, 402-2, 402-3, 402-4, 402-5, 402-6, and 402-7 (collectively, 402). Each DTC zone 402 has its own size and shape and includes its own number of DTC units 214. The number of DTC units 214 of each DTC zone 402 corresponds to a specific capacitance. The more DTC units 214 a DTC zone 402 has, the larger the overall capacitance of the DTC zone has.

As mentioned above, the DTC 120 can be considered as a bank of available DTC units 214, and any number of DTC units 214 can form a capacitor with a capacitance proportional to the number of DTC units 214. Once the design requirement of a chip to be connected to a DTC zone 402 is known, the size of the DTC zone 402 can be calculated accordingly. In one implementation, the number of DTC units 214 is calculated by dividing the target capacitance for the chip by the unit capacitance that one DTC unit 214 provides.

It should be understood that although the DTC region 120 is organized by DTC unit groups 212 and DTC unit cells (not shown), the division does not have to follow the boundaries between the DTC unit groups 212 or the boundaries between the DTC unit cells. In other words, the boundaries among the DTC zones 402 can cross the boundaries between the DTC unit groups 212 or the boundaries between the DTC unit cells. A portion of a DTC unit group 212 can belong to (i.e., be included in) one DTC zone 402, while another portion of the DTC unit group 212 can belong to (i.e., be included in) another DTC zone 402. Therefore, the DTC region 120 can be divided into the DTC zones in a flexible manner.

It should also be understood that all the DTC units 214 are used (i.e., assigned to a DTC zone 402) in the example shown in FIG. 4, this does not have to be the case. In some embodiments, a portion of the DTC region can be unused (i.e., not assigned to any DTC zone 402 and reserved for future use).

It should be understood that the DTC units 214 assigned in one DTC zone 402 can be connected together by, for example, metal tracks in one or more metal layers. In one example, the DTC units 214 assigned in one DTC zone 402 are connected by metal tracks in the M1 layer. In another example, the DTC units 214 assigned in one DTC zone 402 are connected by metal tracks in the M1 layer or the M2 layer. In yet another example, the DTC units 214 assigned in one DTC zone 402 are connected by metal tracks in the M1 layer, the M2 layer, or the M3 layer. Routing resources can be allocated accordingly depending on the geometry, location, and size of the DTC zone 402.

In one embodiment, the capacitance density of the DTC region 120 is larger than 300 nF/mm². In one example, the capacitance density of the DTC region 120 is 320 nF/mm². In another example, the capacitance density of the DTC region 120 is 340 nF/mm².

In one embodiment, the location of each DTC zone 402 is arranged such that the sum of the lateral distances (i.e., in the X-Y plane) between each DTC zone 402 and its corresponding chip is minimized. For example, chip #1 is located at a lower position in the Y-direction than memory #1 (both chip #1 and memory #1 are disposed in a higher or lower plane in the Z-direction than the DTC region 120, as explained above). Hence, the DTC zone 402-1 corresponding to chip #1 is located at a lower position in the Y-direction than the DTC zone 402-7 corresponding to memory #1. As a result, the overall impedance and voltage drop (i.e., IR drop) may be achieved.

Figure 8:
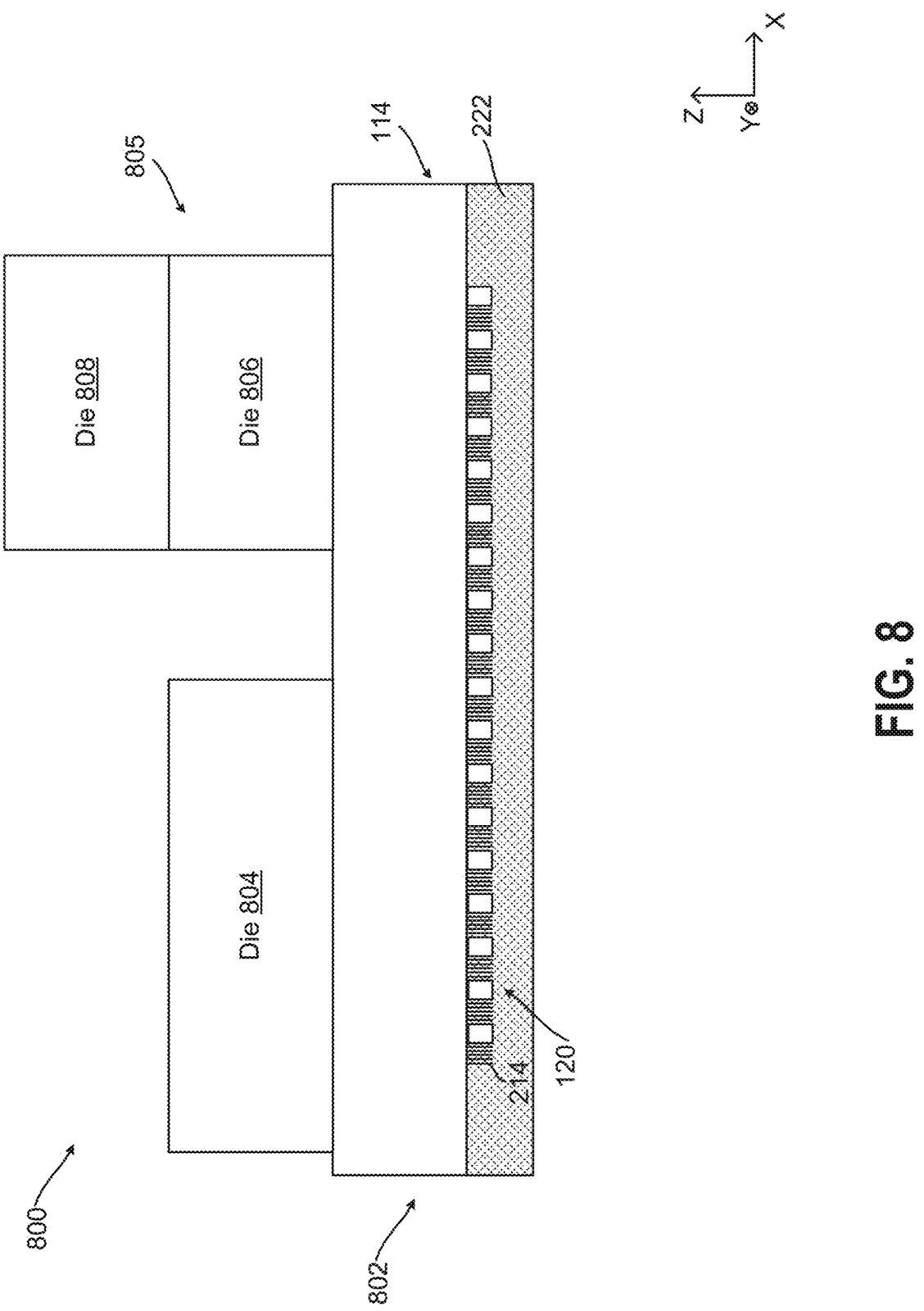
FIG. 8 is a diagram illustrating an example package in accordance with some embodiments.

FIG. 8 is a diagram illustrating an example package 800 in accordance with some embodiments. In the example shown in FIG. 8, the package 800 includes a DTC die 802, a die 804, a die 806, and a die 808. The die 808 is bonded to the top surface of the die 806, forming a die stack 805. In one embodiment, the die 808 is bonded to the top surface of the die 806 using hybrid bonding. The die 804 and the die stack 805 are bonded to the DTC die 802 using, for example, hybrid bonding. The DTC die 802 includes a substrate 222 and a multilayer interconnect (MLI) structure 114. A DTC region 120 is formed in the substrate 222. The DTC region may have a design as illustrated in FIG. 4, where DTC units 214 are extending in two directions (i.e., the X-direction and the Y-direction). The DTC region 120 is divided into multiple DTC zones, one of which is connected to the die 804 and another of which is connected to the die stack 805. The capacitance of each DTC zone is chosen to meet the capacitance requirement of the die 804 and the capacitance requirement of the die stack 805.

FIG. 9 is a flowchart illustrating an example method 900 of fabricating a semiconductor structure including a DTC region in accordance to some embodiments. In the example shown in FIG. 9, the method 900 includes operations 902, 904, 906, 908, 910, and 912. Additional operations may be performed. Also, it should be understood that the sequence of the various operations discussed above with reference to FIG. 9 is provided for illustrative purposes, and as such, other embodiments may utilize different sequences. For example, operation 904 and operation 906 can be performed simultaneously. These various sequences of operations are to be included within the scope of embodiments.

At operation 902, a substrate is provided.

At operation 904, a first group of trenches are formed in the substrate. Each of the first group of trenches extends horizontally in a first direction. At operation 906, a second group of trenches are formed in the substrate. Each of the second group of trenches extends horizontally in a second direction different than the first direction. Each of the first group of trenches and the second group of trenches corresponds to a DTC unit (e.g., the DTC unit 214 shown in FIG. 2)

At operation 908, a first conductive layer is formed in each of the first group of trenches and the second group of trenches. At operation 910, a dielectric layer is formed over the first conductive layer in each of the first group of trenches and the second group of trenches. At operation 912, a second conductive layer is formed over the dielectric layer in each of the first group of trenches and the second group of trenches.

As mentioned above, additional operations may be performed. For example, a chemical mechanical polishing (CMP) may be performed. For example, an inter-level dielectric (e.g., the dielectric in the interposer MLI structure 114 shown in FIG. 1) is formed after the CMP. For example, vias and metal tracks are formed to electrically connect the DTC units to form a capacitor.

In other embodiments, a third group of trenches are formed in the substrate. Each of the third group of trenches extends horizontally in a third direction different than the first direction and the second direction.

In other embodiments, a conductive region may be formed before the trenches are formed, and another dielectric layer is formed in the trenches before the first conductive layer is formed. One skill in the art should appreciate that the method 900 can have various variations and modifications to fabricate the disclosed embodiments herein.

In accordance with some aspects of the disclosure, a semiconductor structure is provided. The semiconductor structure includes a substrate and a deep trench capacitor (DTC) region formed in the substrate. The DTC region includes a plurality of DTC units, and each DTC unit includes: a trench extending downwardly from a top surface of the substrate; a first conductive layer disposed in the trench; a second conductive layer disposed in the trench; and a dielectric layer sandwiched by the first conductive layer and the second conductive layer. Each DTC unit is elongated, and a first group of the plurality of DTC units extend horizontally in a first direction, whereas a second group of the plurality of the DTC units extend horizontally in a second direction.

In accordance with some aspects of the disclosure, a semiconductor package is provided. The semiconductor package includes a semiconductor structure. The semiconductor structure includes: a substrate; a multilayer interconnect (MLI) structure formed on the substrate; and a deep trench capacitor (DTC) region formed in the substrate. The DTC region includes a plurality of DTC units, and each DTC unit includes: a trench extending downwardly from a top surface of the substrate; a first conductive layer disposed in the trench; a second conductive layer disposed in the trench; and a dielectric layer sandwiched by the first conductive layer and the second conductive layer. The semiconductor package further includes one or more chips bonded to the MLI structure of the semiconductor structure, and the DTC region is electrically connected to the one or more chips through the MLI structure. Each of the plurality of DTC units is elongated, and a first group of the plurality of DTC units extend horizontally in a first direction, whereas a second group of the plurality of the DTC units extend horizontally in a second direction.

In accordance with some aspects of the disclosure, a method is provided. The method includes the following steps: providing a substrate; forming a first group of trenches in the substrate, each of the first group of trenches extending horizontally in a first direction; forming a second group of trenches in the substrate, each of the second group of trenches extending horizontally in a second direction different than the first direction; forming a first conductive layer in each of the first group of trenches and the second group of trenches; forming a dielectric layer over the first conductive layer in each of the first group of trenches and the second group of trenches; and forming a second conductive layer over the dielectric layer in each of the first group of trenches and the second group of trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate of an interposer, the interposer being configured to increase interconnect density for a plurality of chips bonded to the interposer; and
a deep trench capacitor (DTC) region formed in the substrate of the interposer, wherein the DTC region comprises a plurality of DTC units, each DTC unit comprises:
a trench extending downwardly from a top surface of the substrate of the interposer;
a first conductive layer disposed in the trench;
a second conductive layer disposed in the trench; and a dielectric layer sandwiched by the first conductive layer and the second conductive layer; and
wherein each DTC unit is elongated, a first group of the plurality of DTC units extend horizontally in a first direction, a second group of the plurality of the DTC units extend horizontally in a second direction;
wherein the plurality of DTC units are divided into a plurality of DTC zones, each of the plurality of DTC zones corresponding to and electrically connected to one of the plurality of chips, and the plurality of chips are horizontally distributed on a top surface of the interposer;

wherein a boundary of at least one of the plurality of DTC zones crosses a boundary of a particular group of the plurality of DTC units, such that a first portion of the particular group is included in a first DTC zone and a second portion of the particular group is included in a second DTC zone.

2. The semiconductor structure of claim 1, wherein the first direction is perpendicular to the second direction.

3. The semiconductor structure of claim 1, wherein a third group of the plurality of DTC units extend horizontally in a third direction.

4. The semiconductor structure of claim 3, wherein a first angle between the first direction and the second direction is 60 degrees, a second angle between the first direction and the third direction is 60 degrees, and a third angle between the second direction and the third direction is 60 degrees.

5. The semiconductor structure of claim 1, wherein the trench has an aspect ratio larger than one.

6. The semiconductor structure of claim 1, wherein the DTC region comprises a plurality of DTC unit groups, each DTC unit group comprising a first number of the DTC units extending horizontally in parallel.

7. The semiconductor structure of claim 6, wherein the first number is an integer equal to or larger than five.

8. The semiconductor structure of claim 6, wherein each of the plurality of DTC unit groups has a rectangular contour.

9. The semiconductor structure of claim 8, wherein the plurality of DTC unit groups are arranged in a plurality of rows and a plurality of columns.

10. The semiconductor structure of claim 6, wherein each DTC unit group has a hexagonal contour.

11. The semiconductor structure of claim 1 further comprising:
a multilayer interconnect (MLI) structure formed on the substrate of the interposer.

12. The semiconductor structure of claim 1, wherein at least a portion of boundaries among the plurality of DTC zones crosses a first boundary of a first DTC unit group.

13. The semiconductor structure of claim 1, wherein a first portion of a first DTC unit group is included in a first DTC zone, and a second portion of the first DTC unit group is included in a second DTC zone.

14. A semiconductor package comprising:
an interposer comprising:
a substrate;
a multilayer interconnect (MLI) structure formed on the substrate; and
a deep trench capacitor (DTC) region formed in the substrate, wherein the DTC region comprises a plurality of DTC units, each DTC unit comprises:
a trench extending downwardly from a top surface of the substrate;
a first conductive layer disposed in the trench;
a second conductive layer disposed in the trench; and
a dielectric layer sandwiched by the first conductive layer and the second conductive layer; and
a plurality of chips bonded to and horizontally distributed on a top surface of the MLI structure of the interposer;
wherein each of the plurality of DTC units is elongated, a first group of the plurality of DTC units extend horizontally in a first direction, a second group of the plurality of the DTC units extend horizontally in a second direction;
wherein the plurality of DTC units are divided into a plurality of DTC zones, each of the plurality of DTC zones being electrically connected through the MLI structure to a corresponding one of the plurality of chips;

wherein a boundary of at least one of the plurality of DTC zones crosses a boundary of a particular group of the plurality of DTC units, such that a first portion of the particular group is included in a first DTC zone and a second portion of the particular group is included in a second DTC zone.

15. The semiconductor package of claim 14, wherein the plurality of DTC units are divided into a plurality of DTC unit groups, each DTC unit group comprising a first number of the DTC units extending horizontally in parallel.

16. The semiconductor package of claim 14, wherein a third group of the plurality of DTC units extend horizontally in a third direction.

17. A method comprising:

providing a substrate of an interposer, the interposer being configured to increase interconnect density for a plurality of chips bonded to the interposer;

forming a first group of trenches in the substrate of the interposer, each of the first group of trenches extending horizontally in a first direction;

forming a second group of trenches in the substrate of the interposer, each of the second group of trenches extending horizontally in a second direction different than the first direction;

forming a first conductive layer in each of the first group of trenches and the second group of trenches;

forming a dielectric layer over the first conductive layer in each of the first group of trenches and the second group of trenches;

forming a second conductive layer over the dielectric layer in each of the first group of trenches and the second group of trenches to form a plurality of deep trench capacitor (DTC) units; and bonding a plurality of chips to a top surface of interposer, wherein the plurality of chips are horizontally distributed on the top surface of the interposer; and wherein the plurality of DTC units are divided into a plurality of DTC zones, each of the plurality of DTC zones corresponding to and electrically connected to one of the plurality of chips, and the plurality of chips are horizontally distributed on a top surface of the interposer;

wherein a boundary of at least one of the plurality of DTC zones crosses a boundary of a particular group of the plurality of DTC units, such that a first portion of the particular group is included in a first DTC zone and a second portion of the particular group is included in a second DTC zone.

18. The method of claim 17, wherein the dielectric layer is a high-κ dielectric layer.

19. The method of claim 17, wherein the first conductive layer and the second conductive layer are polysilicon layers.

20. The method of claim 17, wherein the first direction is perpendicular to the second direction.

* * * * *